United States Patent
Chang et al.

(10) Patent No.: US 8,279,664 B2
(45) Date of Patent: Oct. 2, 2012

(54) PHASE CHANGE MEMORY DEVICE, MEMORY SYSTEM, AND PROGRAMMING METHOD USING VARIABLE VERIFICATION PULSES

(75) Inventors: Sang-Hoan Chang, Suwon-si (KR); Seong-Moo Heo, Seoul (KR); Kwang-Suk Yu, Yongin-si (KR); Yeong-Taek Lee, Seoul (KR); Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 168 days.

(21) Appl. No.: 12/879,157

(22) Filed: Sep. 10, 2010

(65) Prior Publication Data
US 2011/0063904 A1    Mar. 17, 2011

(30) Foreign Application Priority Data
Sep. 11, 2009 (KR) .......................... 10-2009-0085772

(51) Int. Cl.
*G11C 11/00*    (2006.01)
(52) U.S. Cl. ....................................... 365/163; 365/148
(58) Field of Classification Search .................. 365/148, 365/163, 148 X, 163 O
See application file for complete search history.

(56) References Cited

U.S. PATENT DOCUMENTS

| | | | |
|---|---|---|---|
| 6,879,525 B2 | 4/2005 | Van Brocklin et al. | |
| 7,515,460 B2 | 4/2009 | Gordon et al. | |
| 7,529,124 B2 * | 5/2009 | Cho et al. ...................... | 365/163 |
| 8,159,867 B2 * | 4/2012 | Cho et al. ...................... | 365/163 |

FOREIGN PATENT DOCUMENTS

| | | |
|---|---|---|
| KR | 100882125 B1 | 1/2009 |
| KR | 1020090016196 A | 2/2009 |

* cited by examiner

*Primary Examiner* — VanThu Nguyen
(74) *Attorney, Agent, or Firm* — Volentine & Whitt, PLLC

(57) ABSTRACT

In a method of programming a phase change memory device, write data is programmed in a plurality of phase change memory cells by applying write pulses to each of the plurality of phase change memory cells. Whether each of the phase change memory cells is programmed is verified by applying verification pulses to each of the phase-change memory cells. A number of applications for the verification pulses and the intervals between respective applications of the verification pulses are varied in accordance with a verification result for each of the phase-change memory cells.

14 Claims, 13 Drawing Sheets

PHASE CHANGE MEMORY DEVICE, MEMORY SYSTEM, AND PROGRAMMING METHOD USING VARIABLE VERIFICATION PULSES

CROSS-REFERENCE TO RELATED APPLICATIONS

This application claims priority under 35 USC §119 to Korean Patent Application No. 10-2009-0085772 filed on Sep. 11, 2009, the subject matter of which is hereby incorporated by reference.

BACKGROUND

This disclosure relates to semiconductor memory devices, more particularly those incorporating phase change memory cells, as well as memory systems including same and related methods of programming same.

Semiconductor memory devices may be classified as volatile and non-volatile in their operative nature. Volatile memory devices are typically configured to store data by charging/discharging capacitors in memory cells, and are widely used as main memories in a broad range of electronic devices. Volatile memory devices, such as Dynamic Random Access Memory (DRAM) and Static Random Access Memory (SRAM) are able to retain stored data only so long as power is supplied, but lose stored data in the absence of applied power.

In contrast, non-volatile memory devices, such as flash memory, are able to retain stored data in the absence of applied power. Thus, non-volatile memory devices are commonly used to store program code and/or data within computers, mobile devices, etc.

In response to memory devices characterized by high data storage capacity, fast operating speed, and low power consumption, new memory devices have been developed seeking to emulate the DRAM integration density, SRAM operating speed, and the non-volatile operating nature of flash memory all in a single memory device. These next generation memory devices include, for example, the Phase Change Random Access Memory (PRAM) that uses a phase change material to store data, the Resistance Random Access Memory (RRAM) which uses materials having a variable resistance such as transition-metal oxides to store data, and the Magnetic Random Access Memory (MRAM) which uses ferromagnetic materials to store data. The foregoing constituent materials all exhibit a similar characteristic in that their resistance varies in relation to the magnitude and/or direction of an applied voltage and/or current. Yet, once data is programmed using any one of these approaches, the corresponding resistance characteristic will not change when the application of power is interpreted, and no data refresh operation is required.

Each memory cell in these next generation resistive memory devices may be formed with a single resistive element and a corresponding switching element so that data may be stored by controlling the voltage and/or current applied to a bitline and a wordline to thereby change the resistive state of the resistive element.

Unfortunately, the time required to program data in many resistive memory devices, and particularly the PRAM device, is significantly longer than commonly used conventional memory devices. Accordingly, improvements are required to generally reduce the time required to program data in resistive memory devices and increase programming efficiency.

SUMMARY

Certain embodiments of the inventive concept provide a method of programming a phase change memory device, capable of increasing program speed and program efficiency.

Certain embodiments provide a phase change memory device, capable of increasing program speed and program efficiency.

Certain embodiments provide a memory system including the phase change memory device.

According to certain embodiments, in a method of programming a phase change memory device, write data is programmed in a plurality of phase change memory cells by applying write pulses to each of the plurality of phase change memory cells. Whether each of the phase change memory cells is programmed is verified by applying at least one verification pulse to each of the phase-change memory cells. A number of applications for the at least one verification pulse and corresponding intervals between applications of the at least one verification pulse are varied in accordance with a verification result for each of the phase-change memory cells.

The at least one verification pulse may not be applied to a first phase change memory cell when the first phase change memory cell passes the verification.

The at least one verification pulse may be continuously applied to a second phase change memory cell until the second phase change memory cell passes the verification within a predetermined number of applying the at least one verification pulse.

The at least one verification pulse may be applied to each of the phase-change memory cells by regular intervals.

The at least one verification pulse may be applied to each of the phase-change memory cells by increasing intervals.

The second phase change memory cell may be determined to fail the verification, when the second phase change memory cell does not pass the verification within the predetermined number of applying the at least one verification pulse.

The write pulses and the at least one verification pulse may be repeatedly applied to the second phase change memory cell which is determined to fail the verification.

Verifying whether each of the phase change memory cells is programmed may be simultaneously performed on a plurality of groups which include the phase change memory cells.

According to certain embodiments, a phase change memory device includes a memory cell array including a plurality of phase change memory cells, an input/out circuit and a control circuit. The input/output circuit, connected to each of the phase change memory cells through each of plurality of bit line selection transistors, configured to perform program operation, verification operation and read operation on the phase change memory cells. The control circuit controls the input/out circuit such that write data is programmed in the phase change memory cells by applying write pulses to each of the phase change memory cells, whether each of the phase change memory cells is programmed is verified by applying at least one verification pulse to each of the phase-change memory cells and a number of applications for the at least one verification pulse and corresponding intervals for the applications of the at least one verification pulse are varied in accordance with a verification result of each of the phase-change memory cells.

The input/output circuit may include a write driver configured to write data in the each the phase change memory cells by providing the write pulses to each of the phase change memory cells in response to a first control signal; and a sensing unit configured to provide the at least one verification pulse to each of the phase-change memory cells in response to a second control signal, to sense data written in each of the phase-change memory cells in response to a third control signal and to compare the sensed data with the write data to provide a comparison signal.

The sensing unit may include a precharging unit configured to apply the at least one verification pulse to the phase change memory cell; a sense amplifier configured to sense the data written in the phase change memory cell; and a comparator configured to compare the sensed data with the write data to provide the comparison signal.

The sensing unit may include a precharging unit configured to apply the at least one verification pulse to the phase change memory cell; and a sense amplifier configured to compare the data written in the phase change memory cell with a reference voltage to provide the comparison signal.

The control circuit may include a control voltage generating unit configured to generate first and second control voltages for generating the write pulses and the at least one verification pulse; a counter configured to count the comparison signal from the sensing unit to provide an output signal; a delay unit configured to generate a delay control signal for controlling an applying time of the at least one verification pulse, in response to the output signal; and a state circuit configured to receive the comparison signal and the output signal to output a state signal representing whether each of the phase change memory cells is programmed.

The control circuit may control the state circuit such that the state signal represents "fail", when the comparison signal does not represents "program pass" within a predetermined value.

The phase change memory device may further include an input/output buffer that temporarily stores the write data. The control circuit may control the input/output buffer and the input/output circuit such that the verification operation is simultaneously performed on a plurality of groups which include the phase change memory cells.

According to certain embodiments, a memory system include a phase change memory device having a plurality of phase change memory cells for storing data; and a memory controller that controls the phase change memory device. The phase change memory device further includes an input/output circuit and a control circuit. The input/output circuit, connected to each of the phase change memory cells through each of plurality of bit line selection transistors, configured to perform program operation, verification operation and read operation on the phase change memory cells. The control circuit controls the input/out circuit such that write data is programmed in the phase change memory cells by applying write pulses to each of the phase change memory cells, whether each of the phase change memory cells is programmed is verified by applying at least one verification pulse to each of the phase-change memory cells and a number of applying the at least one verification pulse and intervals of applying the at least one verification pulse are varied based on each verification result of each of the phase-change memory cells.

Accordingly, program time and current consumption may be reduced and program efficiency may be enhanced by varying a number of applying the verification pulses and intervals of applying the verification pulses according to each verification result of each of the phase-change memory cells.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
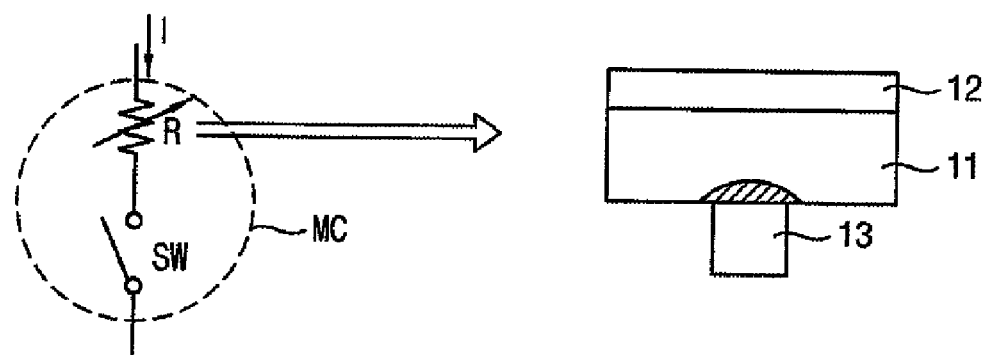
FIG. 1 is a diagram illustrating one example of an input buffer circuit according to certain embodiments of the inventive concept.

Various example embodiments of the inventive concept will now be described in some additional detail with reference to the accompanying drawings. The inventive concept may, however, be embodied in many different forms and should not be construed as being limited to only the illustrated embodiments. Rather, these example embodiments are provided so that this disclosure will be thorough and complete, and will fully convey the scope of the present inventive concept to those skilled in the art. In the drawings, the size and relative sizes of layers and regions may be exaggerated for clarity. Throughout the drawings and written description, like reference numbers and labels are used to indicate like or similar elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a phase change memory cell susceptible to being programmed using a programming method according to certain embodiments of the inventive concept.

Referring to FIG. 1, a phase change memory cell MC includes a resistive element R and a switching element SW. The switching element SW may be implemented with various elements such as metal oxide semiconductor (MOS) transistor and a diode. The resistive element R includes phase change layer 11 which has an alloy of germanium (Ge), antimony (Sb) and tellurium (Te), which is referred to commonly as a GST alloy (or phase change material), an upper electrode 12 formed above the phase change layer 11, and a lower electrode 13 formed below the phase change layer 11.

The GST alloy 11 may be programmed to one of an amorphous, or "reset" state representing relatively high resistivity and a crystalline, or "set" state representing relatively low resistivity by heating the phase change layer 11. The "reset" state may correspond to logic "1", and the "set" state may correspond to logic "0". Alternatively, the "reset" state may correspond to logic "0", and the "set" state may correspond to logic "1".

In FIG. 1, when a pulse current I is applied to the phase change memory cell MC, the pulse current I flows through the lower electrode 13. When the pulse current I is applied to the memory cell MC during a very short time, portions, of the phase change layer 11, adjacent to the lower electrode 13 is heated by joule heat of the pulse current I. The cross-hatched portion of the phase change layer 11 is transformed to one of the "reset" state and the "set" state in accordance with the corresponding heating profile.

Figure 2:
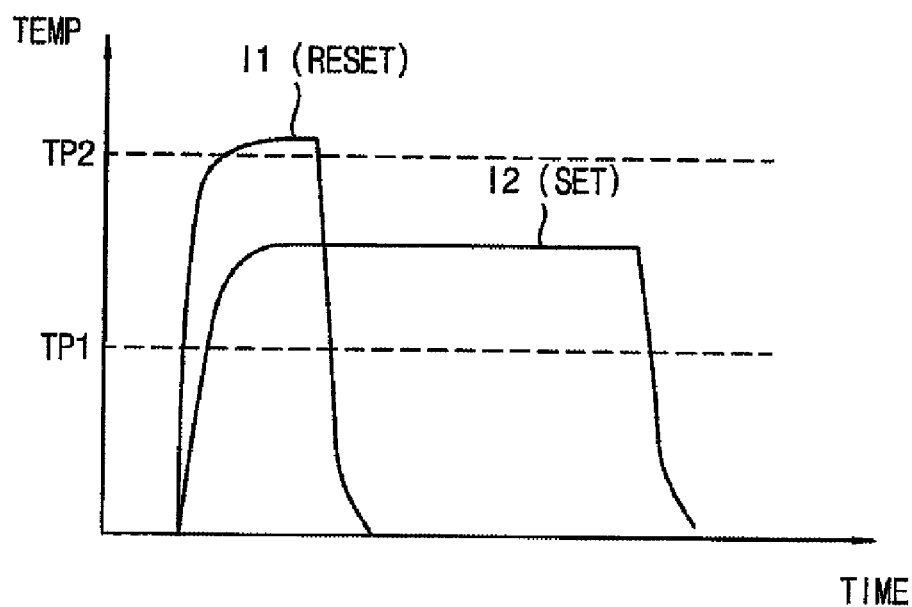
FIG. 2 is a graph illustrating model temperature profiles for a phase change memory cell as applied during a program operation.

FIG. 2 is a graph illustrating model temperature profiles for a phase change memory cell during a program operation.

Referring to FIG. 2, the phase change memory cell MC is programmed to the reset state by applying a current (reset pulse) "I1" to the phase change memory cell MC for a first time period to heat the phase change layer 11 to above temperature TP2. After the phase change layer 11 reaches the temperature TP2, the current "I1" is no longer applied to the phase change memory cell MC and the phase change layer 11 rapidly cools. The phase change memory cell MC is programmed to the set state by applying a current (set pulse) "I2" to the phase change memory cell MC for a second time period longer than the first time period to heat the phase change layer 11 to above temperature TP1 and maintains the phase change layer 11 above the temperature TP1 through the second time period. Then, after the second time period, the current "I2" is no longer applied to the phase change memory cell MC, allowing the phase change layer 11 to cool. The temperature TP1 represents a melting point of the phase change layer 11 and the temperature TP2 represents a crystallization temperature of the phase change layer 11.

Figure 3:
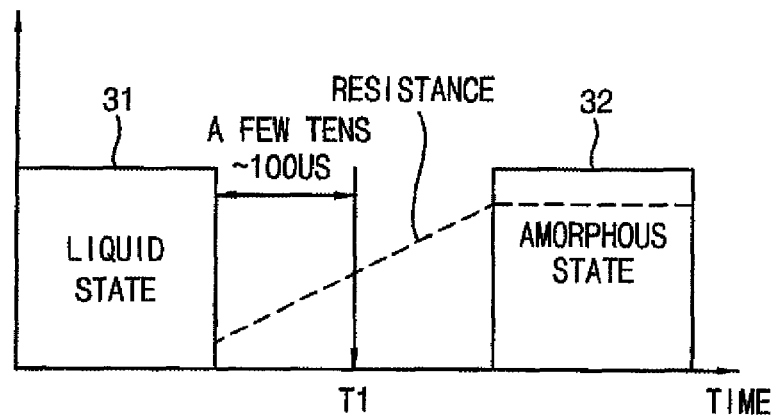
FIG. 3 illustrates a state change for a phase change material within a phase change memory cell.

FIG. 3 illustrates a state change for phase change material (e.g., a layer of phase change material) within the phase change memory cell.

Referring to FIG. 3, when the reset pulse (I1) is applied to the phase change memory cell MC, the phase change layer 11 is transformed from liquid state 31 to the crystalline state 32. While the phase change layer 11 is transformed from liquid state 31 to the crystalline state 32, resistance of the phase change layer 11 gradually increases with time. That is, the resistance of the phase change layer 11 drifts. As illustrated in FIG. 3, it takes a first time T1 (e.g., tens of microseconds to 100 microseconds) for phase change layer 11 to be transformed from the liquid state 31 to the crystalline state 32.

Conventionally, verification pulses are applied to the phase change memory cell MC to verify whether the phase change memory cell is properly programmed after the phase change material 11 is transformed from the liquid state 31 to the crystalline state 32. However, most of the phase change memory cells have resistances sufficient to be correctly read after the write pulses are applied for, (e.g.,) about 5 microseconds after the write pulses are applied to the phase change memory cells.

Therefore, according to certain embodiments of the inventive concept, the verification pulses are applied to the phase change memory cell for verifying whether the phase change memory cell is properly programmed before the phase change layer 11 arrives at a stable state instead of the verification pulses being applied to the phase change memory cell after the phase change layer 11 arrives at the stable state (T1), (i.e., between tens of microseconds and about 100 microseconds). The verification pulse is applied to each of the phase change memory cells, and the verification pulse is repeatedly applied to a phase change memory cell which does not pass the verification. While the verification pulse is repeatedly applied to the phase change memory cell which does not pass the verification, resistance of the phase change memory cell becomes greater, and thus, the phase change memory cell has more chance of passing the verification in response to the verification pulse which is applied later.

Hereinafter, a method of programming a phase change memory cell according to certain embodiments of the inventive concept will be described with reference to FIGS. 4 and 5.

Figure 4:
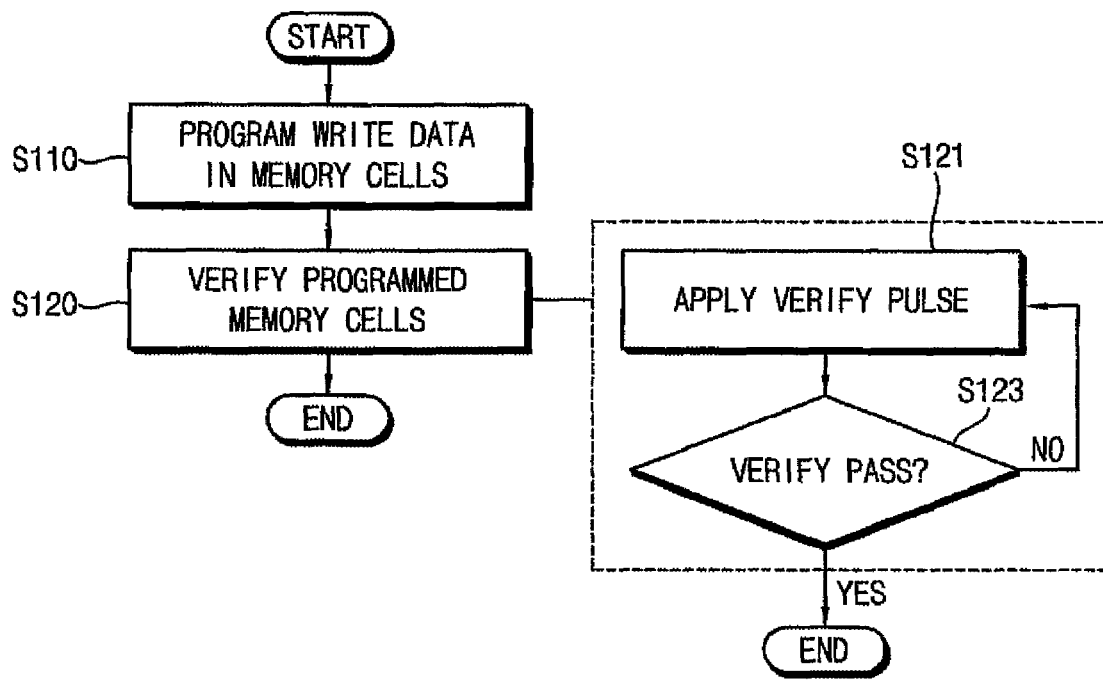
FIG. 4 is a flow chart summarizing a method of programming a phase change memory cell according to certain embodiments of the inventive concept.
Figure 5:
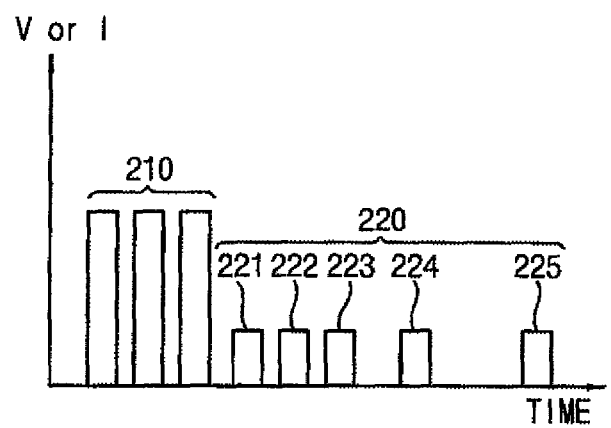
FIG. 5 illustrates write pulses and verification pulses which may be applied to the phase change memory cells.

FIG. 4 is a flow chart summarizing a method of programming a phase change memory cell according to certain embodiments of the inventive concept, and FIG. 5 illustrates exemplary write and verification pulses applied to the phase change memory cells within this method.

Referring to FIGS. 4 and 5, in a method programming a phase change memory device according to certain embodiments of the inventive concept, write data are programmed in a plurality of phase change memory cells by applying write pulses 210 to each of the plurality of phase change memory cells (S110). The write data may correspond to reset data, and the write pulse may correspond to the reset pulse (I1) of FIG. 2. Whether each of the phase change memory cells is programmed is verified by applying at least one verification pulse 220 to each of the phase-change memory cells (S120). That is, the illustrated step S120 may include multiple iterations steps S121 and S123. In step S121, verification pulses 220 are applied to each of the phase change memory cells. In step S123, a determination is made as to whether each of the phase change memory cells passes verification. In step S123, when a first phase change memory cell of the phase change memory cells passes the verification (S123=YES), the verification pulses are not applied to the first phase change memory cell. In the step S123, when a second phase change memory cell of the phase change memory cells does not pass the verification (S123=NO), the verification pulses are not applied to the second phase change memory cell.

The number of time the verification pulses 220 are applied and the respective intervals of application will vary according to each verification result for the phase-change memory cells. For example, when a verification pulse 221 is applied to one of the phase change memory cells, and the one of the phase change memory cells passes the verification, verification pulses are not any more applied to the one of the phase change memory cells. In another example, when the verification pulse 221 is applied to another phase change memory cell of the phase change memory cells, and another phase change memory cell does not pass the verification, another verification pulse 222 may be applied to another phase change memory cell after predetermined time. When another phase change memory cell does not pass the verification despite the verification pulse 222, another verification pulse 223 may be applied to another phase change memory cell after predetermined time. When another phase change memory cell does not pass the verification despite the verification pulse 223, verification pulses 224 and 225 may be repeatedly applied to another phase change memory cell within a predetermined number. When another phase change memory cell does not pass the verification despite the verification pulse 225, another phase change memory cell may be determined to fail the verification finally.

When the verification pulses 220 are again applied to a phase change memory cell which does not pass the verification, the phase change memory cell may have more chance of passing the verification in response to the verification pulse which is applied later because resistance of the phase change layer 11 gradually increases with time as illustrated in FIG. 3. In addition, the verification pulses may be simultaneously applied to a plurality of groups, each group including a number of phase change memory cells, respectively.

Figure 6:
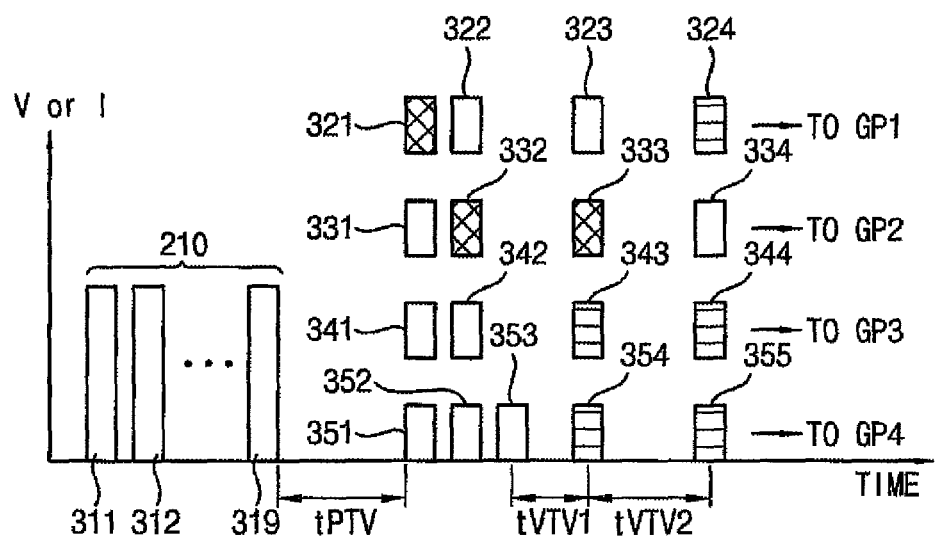
FIG. 6 illustrates a verification operation simultaneously performed across a plurality of memory cell groups.

FIG. 6 illustrates that the verification operation is simultaneously performed on a plurality of groups.

Referring to FIG. 6, write pulses are applied to each one of a plurality groups including (e.g.) groups GP1, GP2, GP3 and GP4. For example, each of the groups may include phase change memory cells connected to one word line. This scheme may be referred to as "buffered program" which is possible using an input/output circuit 400 and an input/output buffer 700 of FIG. 9.

Referring again to FIG. 6, verification pulses are simultaneously applied to each of the groups GP1, GP2, GP3 and GP4 after the write pulses are applied. The verification pulses 321, 332 and 333 represent verification failure after the verification operation is performed. In addition, the verification pulses 322, 323, 331, 334, 341, 342, 351, 353 and 353 represent verification pass after the verification operation is performed. In addition, the verification pulses 324, 343, 344, 354 and 355 represent verification skip, i.e., that the verification pulses are not applied after the verification operation is performed.

Each of the verification pulses 321, 331, 341, and 351 is applied to each of the phase change memory cells included in each of the groups GP1, GP2, GP3 and GP4. The phase change memory cells which receive the verification pulses 321 and 332 do not pass (fail) the verification and the phase change memory cells which receive the verification pulses 331, 341, 351, 332, 342, 352 and 353 pass the verification after the verification pulses 321, 331, 341, 351, 322, 332, 342, 352 and 353 are applied. Therefore, the verification pulse 323 is again applied to the phase change memory cell which has received the verification pulse 321 after a predetermined time tVTV1. The verification pulse 332 is again applied to the phase change memory cell which has received the verification pulse 331, and the phase change memory cell which has received the verification pulse does not pass the verification. The phase change memory cells which have received verification pulses 341 and 351, do not receive the verification pulses 343 and 354 any more, because the phase change memory cells which have received verification pulses 341 and 351 pass the verification. Each of the verification pulses 323 and 333 is simultaneously applied to each of the groups GP1 and GP2. The phase change memory cell which has received the verification pulse 333 does not pass the verification. In addition, the phase change memory cell which has received the verification pulse 323 passes the verification. Therefore, the verification pulse 334 is again applied to the phase change memory cell which has received the verification pulse 333 after a predetermined time tVTV2. While the verification pulse 334 is applied, the verification pulses 324, 344 and 355 are not applied to the phase change memory cells which have already passed the verification. The verification pulses 321 and 323 are applied to a same phase change memory cell included in the group GP1. The verification pulses 332, 333 and 334 are applied to a same phase change memory cell included in the group GP2.

In FIG. 6, time tPTV represents program-to-verify time, which corresponds to a time before T1. Time tVPV1 represents verify-to-verify time, which corresponds to time interval between the verification pulses 321, 331, 341, 351, 322, 332, 342, 352 and 353 and the verification pulses 323, 333, 343 and 353. In addition, time tVPV2 represents verify-to-verify time, which corresponds to time interval between the verification pulses 323, 333, 343, 354 and the verification pulses 324, 334, 344 and 355. In FIG. 6, it is noted that the time tVPV2 is longer that the time tVPV1. In addition, FIG. 6 illustrates a case, but not limited to, that 9 word lines are simultaneously buffered-programmed, and 4 word lines are simultaneously verified.

Figure 7:
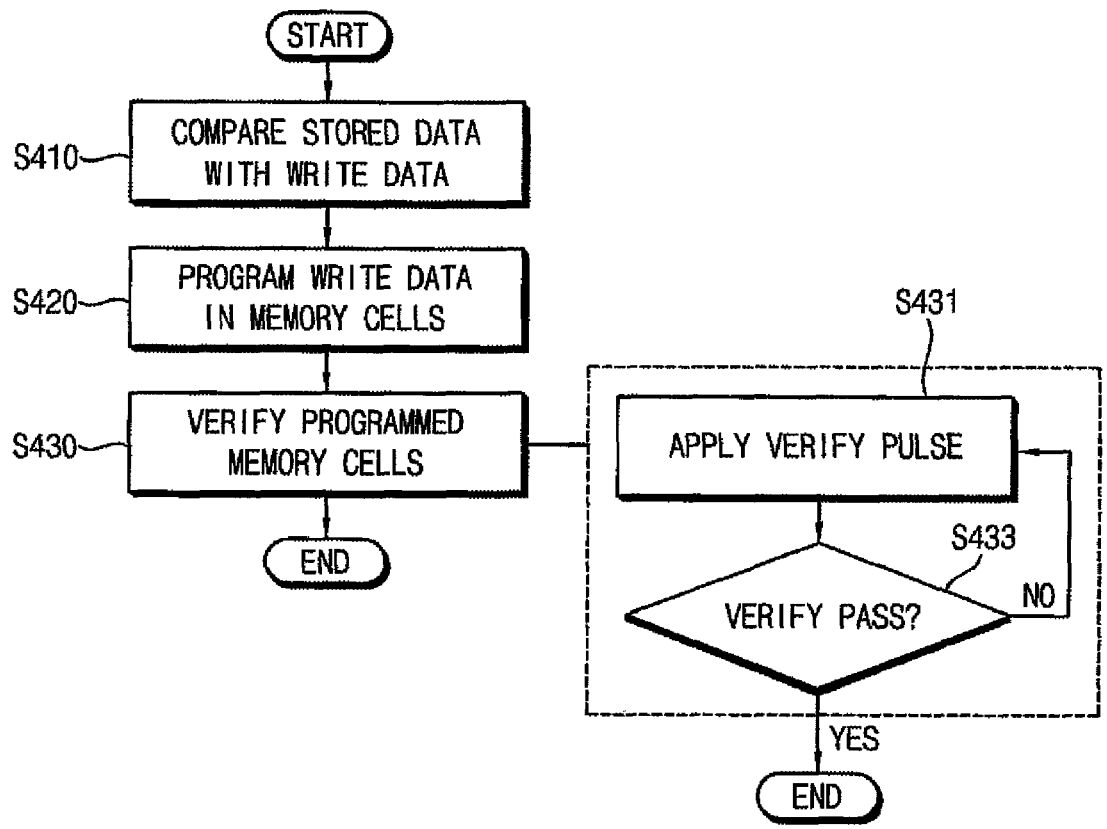
FIG. 7 is a flowchart summarizing a method of programming a phase change memory cell according to certain embodiments of the inventive concept.

FIG. 7 is a flowchart summarizing a method of programming a phase change memory cell according to additional embodiments of the inventive concept.

The method of programming a phase change memory device illustrated in FIG. 7 further includes a step S410 as compared with the method of programming a phase change device illustrated in FIG. 4. Each of steps S420 and S430 is respectively identical to the steps S110 and S120 previously explained. So, a detailed description of steps S420 and S430 will be omitted. Step S430 further includes steps S431 an S433, just as step S120 included steps S121 and S123. In step S431, verification pulses are applied to each of the phase change memory cells. In step S433, a determination is made as to whether each of the phase change memory cells passes the verification. In step S433, when a first phase change memory cell of the phase change memory cells passes the verification (S433=YES), the verification pulses are not applied to the first phase change memory cell. In step S433, when a second phase change memory cell of the phase change memory cells does not pass the verification (S433=NO), the verification pulses are not applied to the second phase change memory cell.

Referring to FIG. 7, whether write data is identical to data stored in each of the phase change memory cells is determined in the method of programming the phase change memory cell S410. Write pulses are applied to phase change memory cells which have stored data different from the write data, and then verification pulses are applied to the to phase change memory cells which receive the write pulses. Here, applying the write pulses corresponds to overwriting the write data to the phase change memory cell without erasing the phase change memory cell. The method of programming the phase change memory device may be applicable to a single level cell which stores one-bit data or a multi-level cell which stores multi-bit data.

Hereinafter, a phase change memory device and a memory system including the resistive memory device will be described. The above described method of controlling operations of a resistive memory device will be more clearly understood from the following detailed description of a resistive memory device and a memory system.

Figure 8:
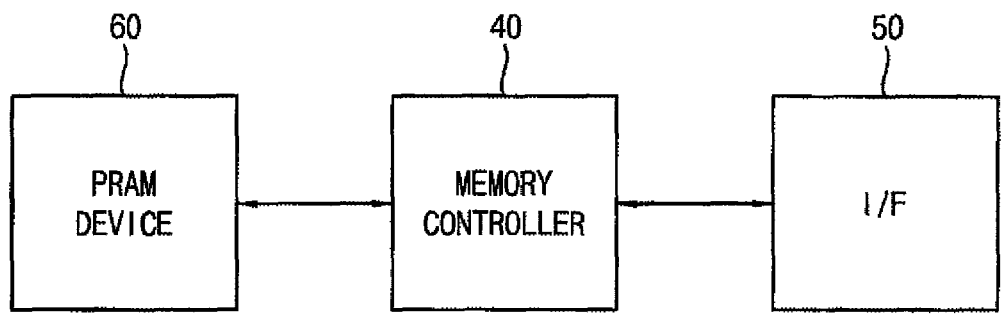
FIG. 8 is a general block diagram of a memory system incorporating a memory device according to certain embodiments of the inventive concept.

FIG. 8 is a general block diagram illustrating a memory system incorporating a resistive memory device (e.g., a PRAM) according to certain embodiments of the inventive concept.

Referring to FIG. 8, a memory system 1000 comprises a phase change memory device 60 and a memory controller 40. The memory system 1000 may further comprise an interface (I/F) 50 configured to enable communication with an external device and/or a user.

The phase change memory device 60 includes a plurality of phase change memory cells for storing data. The phase change memory device 60 will be further described with reference to FIGS. 9 through 17. The memory controller 40 controls overall input/output operations of the phase change memory device 60.

Figure 9:
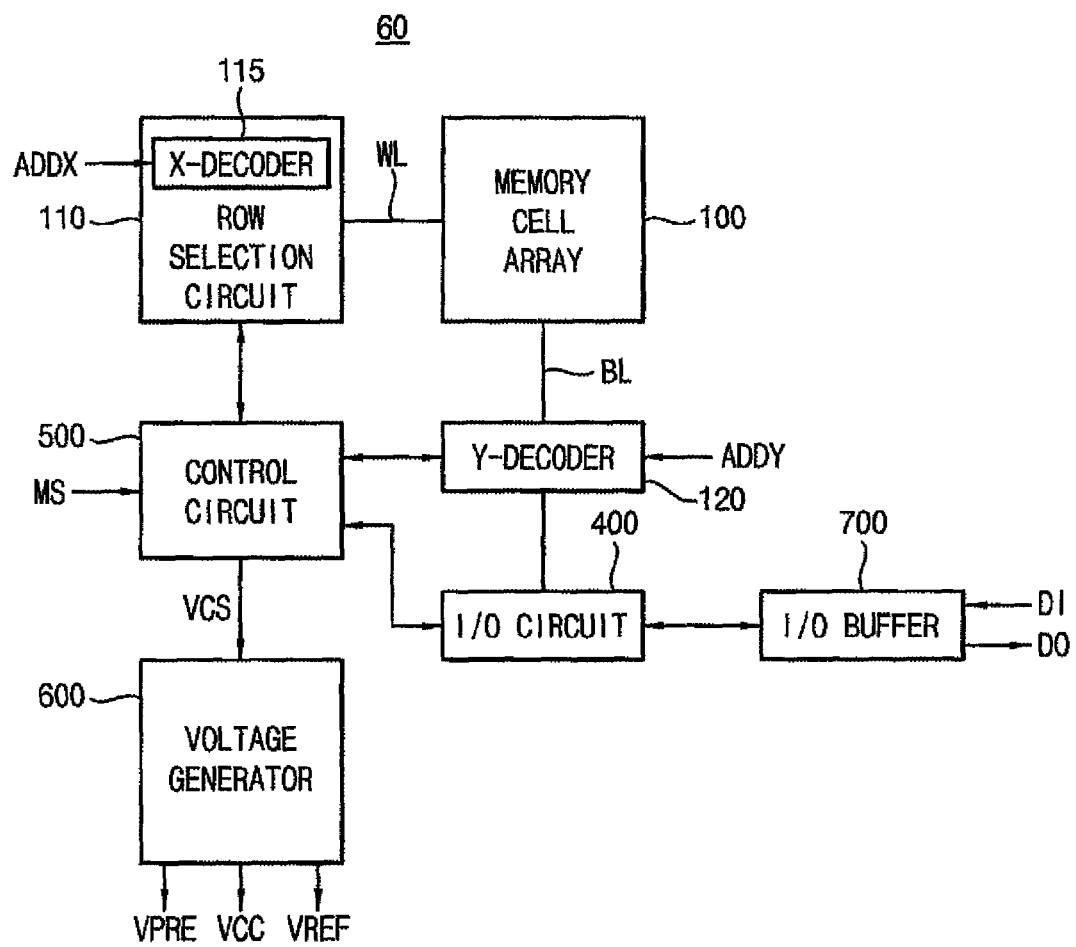
FIG. 9 is a block diagram illustrating a phase change memory device according to certain embodiments of the inventive concept.

FIG. 9 is a block diagram further illustrating a phase change memory device according to certain embodiments of the inventive concept.

Referring to FIG. 9, a phase change memory device 60 comprises a memory cell array 100, a control circuit 500 and a voltage generator 600. In addition, the phase change memory device 60 may further comprise a row selection circuit 110, a column decoder (Y-DECODER) 120, an input/out (I/O) circuit 400 and an I/O buffer 700. Even though elements required for describing inventive concept are illustrated in FIG. 9, the phase change memory device 60 may include an address buffer, a data buffer, a command buffer, a pre-decoder, and other peripheral circuits—as will be appreciated by those skilled in the art.

The memory cell array 100 includes a plurality of phase change memory cells for storing data. Selection of the phase change memory cells is performed by row selection circuit 110 coupled to the memory cells through wordlines WL. While FIG. 9 only shows a single wordline WL and bitline BL for ease of illustration, it is to be understood that respective phase change memory cells within the memory cell array 100 are at an intersection of a corresponding plurality of wordlines and bitlines, and are selected in accordance therewith.

The row selection circuit 100 includes a row decoder (X-DECODER) 115 that selects a wordline WL based on a row address ADDX, and a wordline driver (not illustrated) that applies corresponding voltages to the selected wordline and unselected wordlines. The data are written into and read out from the phase change memory cells under control of the column decoder 120 the I/O circuit 400, which are coupled to the memory cells through bitlines BL.

The control circuit 500 generates control signals for controlling input/output operation of data in response to a mode signal MS. The mode signal MS may be provided from an external device such as the memory controller 40 of FIG. 8, or may be generated in the control circuit 500 based on the address signals ADDX and ADDY.

The control signals generated by the control circuit 500 may include timing control signals and voltage control signals. The timing control signals may include a write enable signal WEN, a read enable signal REN, a sense enable signal SEN, a discharge signal DIS, a precharge signal PRE, etc. The control circuit 500 controls activation timing and/or activation duration of the timing control signals according to the input-output operation of the data. The timing control signals are provided to row selection circuit 110, the column decoder 120 and the I/O circuit 400.

The voltage control signals may include signals for designating levels of a power supply voltage VCC, a precharge voltage VPRE, a reference voltage VREF, etc. The control circuit 500 adjusts the voltage control signal according to the input-output operation of the data. The voltage generator 600 generates the voltages for the input-output operation of the data in response to the voltage control signal from the control circuit 500.

Figure 10:
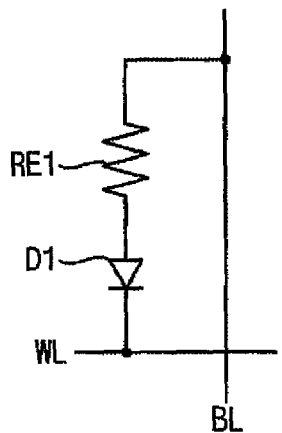
FIG. 10 is a circuit diagram illustrating one example of a phase change memory cell within the memory cell array in FIG. 9.

FIG. 10 is a circuit diagram illustrating one example of a phase change memory cell of the memory cell array in FIG. 9.

Referring to FIG. 10, a memory cell may include a phase change element RE1 and a diode D1 serially coupled between a bitline BL and a wordline WL. The memory cell of FIG. 10 may determine a resistance distribution of the phase change element RE1 by controlling voltages applied to the bitline BL and the wordline WL. The configuration of the memory cell of FIG. 10 may be adopted when the phase change element RE1 is a unipolar type. The write operation may be performed by applying the voltages to the bitline BL and the wordline WL, thereby controlling a voltage difference between both ends of the phase change element RE1 or controlling a current flowing through the phase change element RE1.

Figure 11:
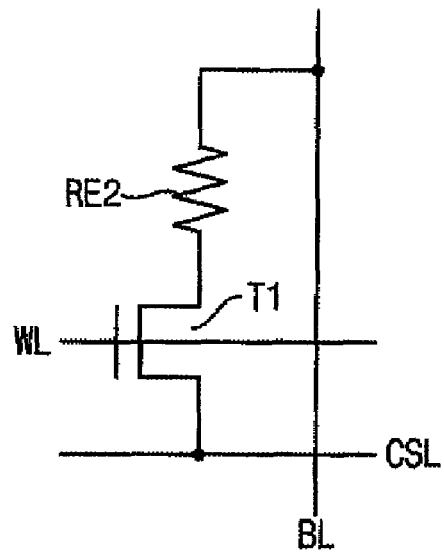
FIG. 11 is a circuit diagram illustrating another example of a resistive memory cell within the memory cell array in FIG. 9.

FIG. 11 is a circuit diagram illustrating another example of a resistive memory cell of the memory cell array in FIG. 9.

Referring to FIG. 11, a memory cell may include a phase change element RE2 and a switching element such as a transistor T1 serially coupled between a bitline BL and a common source line CSL. A gate of the transistor T1 is coupled to a wordline WL. The memory cell of FIG. 11 may determine a resistance distribution of the phase change element RE2 by controlling voltages applied to the bitline BL and the common source line CSL. The configuration of the memory cell of FIG. 11 may be adopted when the phase change element RE2 is a bipolar type as well as a unipolar type.

When the phase change element RE2 is a unipolar type, a resistance of the phase change element RE2 is controlled by magnitude of applied voltage. When the phase change element RE2 is a bipolar type, the resistance of the phase change element RE2 may be controlled by direction (i.e. polarity) of the applied voltage as well as magnitude of the applied voltage. The write operation may be performed by applying the voltages to the bitline BL and the common source line CSL, thereby controlling a voltage difference between both ends of the phase change element RE2 or controlling a current flowing through the phase change element RE2.

Figure 12:
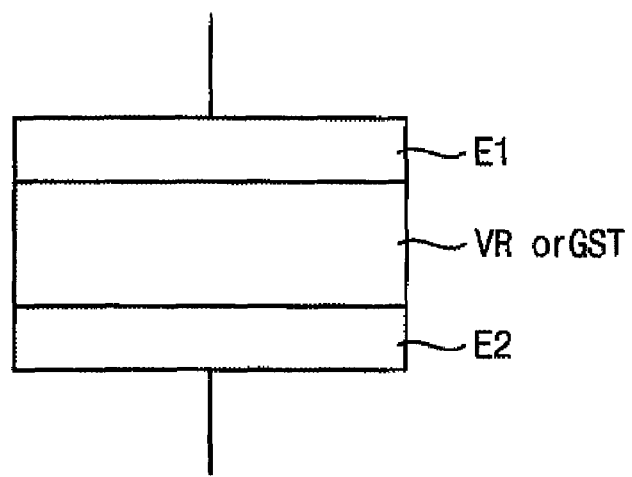
FIG. 12 is a diagram illustrating a unipolar phase change element in the phase change memory cell of FIGS. 10 and 11.

FIG. 12 is a diagram illustrating a unipolar phase change element in the phase change memory cell of FIGS. 10 and 11.

Referring to FIG. 12, the phase change element RE1 of FIG. 10 or the phase change element RE2 of FIG. 11 may include a first electrode E1, a second electrode E2 and phase change material between the electrodes E1 and E2. The electrodes E1 and E2 may be formed with metal such as tantalum (Ta), platinum (Pt), etc. The phase change material may include transition-metal oxide (VR) such as cobalt oxide, or phase change material such as GeSbTe (GST), etc. The phase change material may be in amorphous state or in crystalline state depending on heating time and/or heating temperature, and thus the phase change material may change its resistance according to phase change.

PRAM using phase change materials, RRAM using materials having variable resistance, and MRAM using ferromagnetism materials may be differentiated from each other, and those may be totally referred to as resistive memories. Method and devices according to example embodiments may be applied to various resistive memories including PRAM, RRAM and MRAM.

The phase change material between the electrodes E1 and E2 is required to have a plurality of stable states having different resistance, and various phase change materials are being studied.

For example, while increasing a voltage applied to material having characteristic of Negative Differential Resistance (NDR), resistance of the NDR material abruptly increases at a reset voltage (Vreset), the relatively high resistance is maintained afterwards, and then the NDR material transitions to a state of relatively low resistance at a set voltage (Vset). In this case, the set voltage (Vset) for decreasing the resistance of the NDR material is greater than the reset voltage (Vreset) for decreasing the resistance of the NDR material.

Chalcogenide using telluride compound such as GeSbTe has relatively high resistance when relatively low voltage is applied, and transitions to a state of relatively low resistance if a sufficiently high voltage is applied. In this case, the set voltage (Vset) for decreasing the resistance of the Chalcogenide is smaller than the reset voltage (Vreset) for decreasing the resistance of the Chalcogenide.

As such, an ON-state of relatively low resistance and an OFF-state of relatively high resistance may be programmed or written into memory cells by applying the set voltage (Vset) and the reset voltage (Vreset) corresponding to characteristics of various materials included in the memory cells.

Figure 13:
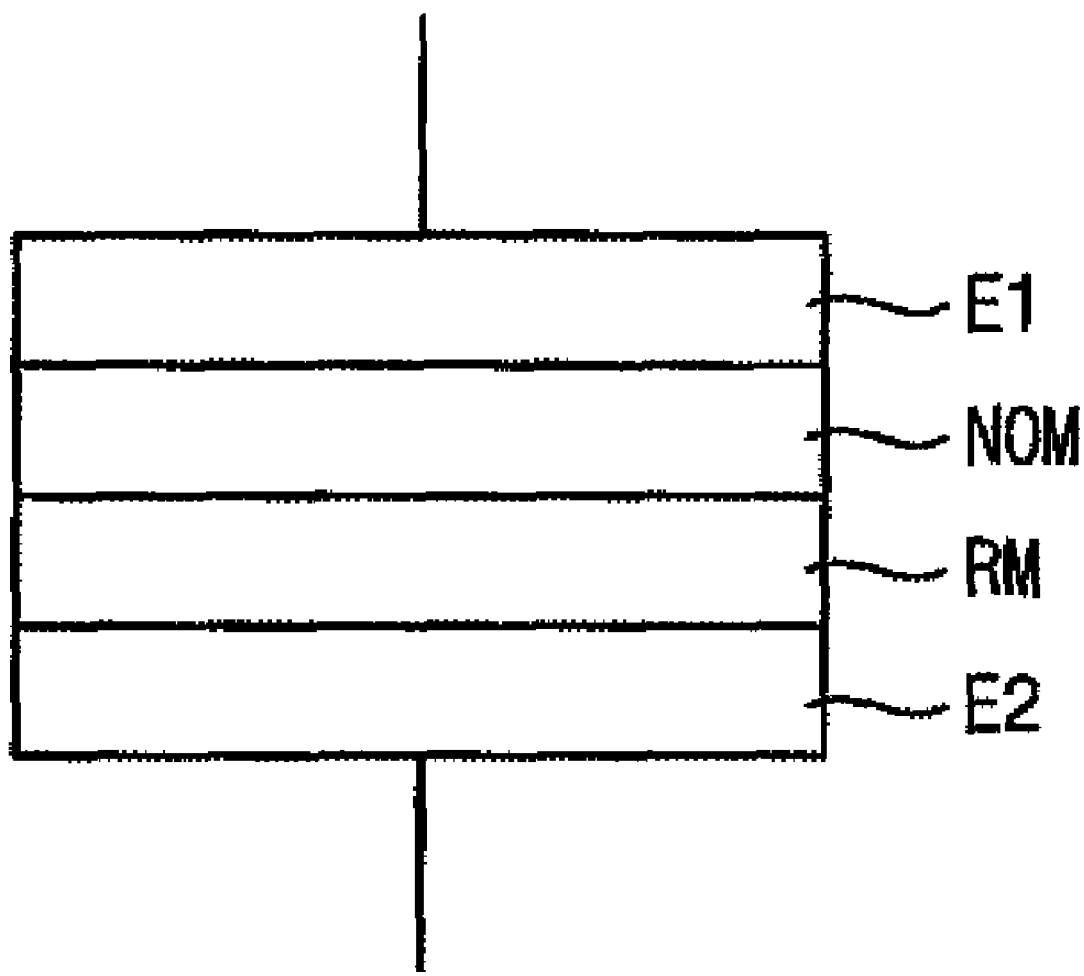
FIG. 13 is a diagram illustrating a bipolar phase change element in the phase change memory cell of FIG. 11.

FIG. 13 is a diagram illustrating a bipolar phase change element in the phase change memory cell of FIG. 11.

Referring to FIG. 13, the phase change element RE2 of FIG. 13 may include a first electrode E1, a second electrode E2, non-ohmic material (NOM) and phase change material (RM) between the electrodes E1 and E2. In this case, the ON-state and the OFF-state may be programmed or written into memory cells by applying opposite voltages to the electrodes E1 and E2. In other words, the ON-state and the OFF-state may be determined according to polarity of the applied voltage.

Figure 14:
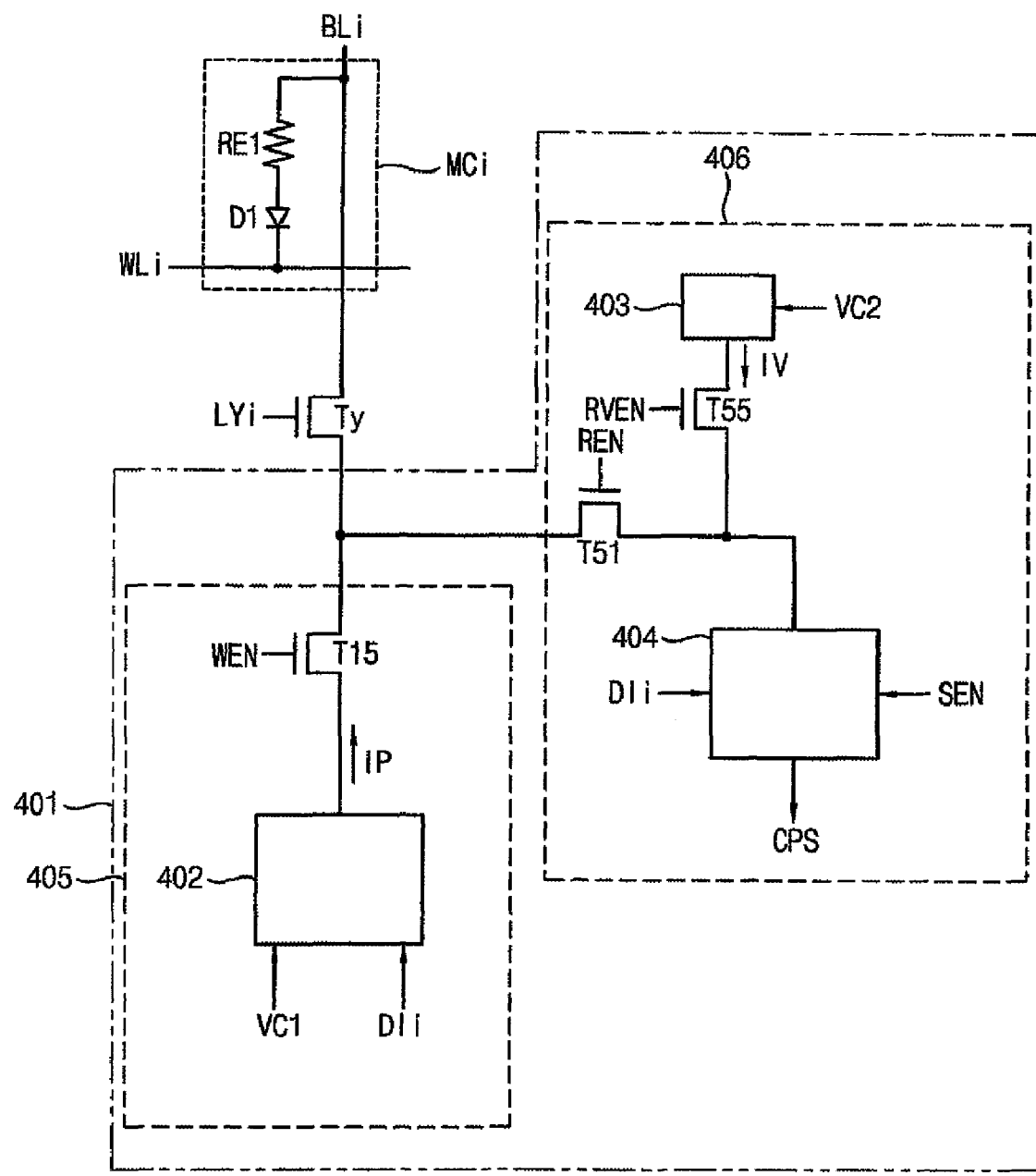
FIG. 14 is a circuit diagram illustrating one example of the I/O circuit in the phase change memory device of FIG. 9.

FIG. 14 is a circuit diagram illustrating an example of the I/O circuit in the phase change memory device of FIG. 9.

For convenience of description, only one phase change memory cell MC1 of a plurality of phase change memory cells in a memory cell array is illustrated in FIG. 14. The I/O circuit 401 is an example which is applicable to the phase change memory cell MC1.

Referring to FIG. 14, the phase change memory cell MC1 is coupled between a wordline WLi selected based on a row address ADDX and a bitline BLi selected by a transistor Ty in response to a bit LYi of a column address ADDY. The phase change memory cell MC1 has a configuration as described with reference to FIG. 10. In addition, FIG. 14 illustrates a write driver 405 for writing data into the phase change memory cell MC1, and a sensing unit 406 for reading the stored data from the phase change memory cell MC1. The configuration of FIG. 14 may be applied to a phase change memory cell of a unipolar type.

The write driver 405 may include a write pulse generator 402 and a transistor T15. When a write enable signal WEN is activated to logic high level, the transistor T15 is turned ON to electrically connect the write driver 405 and the bitline BLi. The write pulse generator 402 applies a write pulse IP corresponding to input data DIi to the phase change memory cell MC1 in response to a first control voltage VC1, and a voltage due to the write pulse IP is applied to two terminals of the phase change element RE1. The input data DIi may be provided from the I/O buffer 700.

The sensing unit 406 may include transistors T51 and T55, a verification (read) pulse generator 403 and a sense amplifying unit 404. When a read enable signal REN and verification enable signal RVEN are activated to logic high level, the transistor T51 is turned ON to electrically connect the sensing unit 406 to the phase change memory cell MC1. The verification (read) pulse generator 40 applies a verification (read) pulse IV in response to a second control voltage VC2 which is according to an operation mode. The phase change memory cell MC1 provides a read voltage Vr according to a resistance of the phase change memory cell MC1. The sense amplifying unit 404 compares the read voltage Vr with the input data DIi to provide a comparison signal CPS indicating whether the phase change memory cell MC1 is in the ON state or the OFF state, in response to a sense enable signal SEN. The comparison signal CPS is also provided to the control circuit 500 in FIG. 9 and the control circuit 500 determines that the phase change memory cell MC1 passes the verification or not according to a logic level of the comparison signal CPS, and the control circuit 500 controls a number and intervals of applying the verification (read) pulse by adjusting the level of the second control voltage VC2 according to the determination result.

Figure 15:
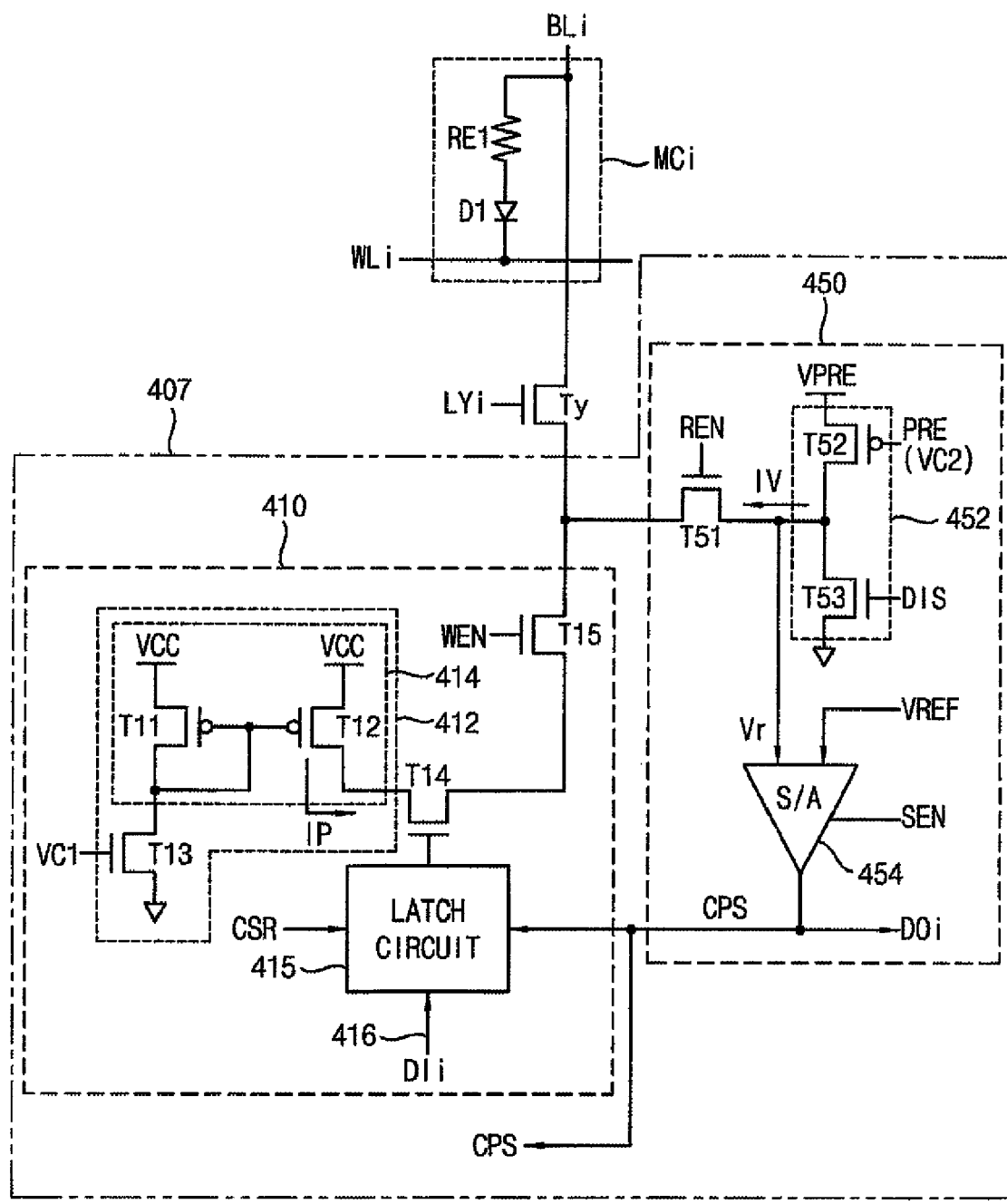
FIG. 15 is a circuit diagram illustrating another example of the I/O circuit in the phase change memory device of FIG. 9.

FIG. 15 is a circuit diagram illustrating another example of the I/O circuit in the phase change memory device of FIG. 9.

For convenience of description, only one phase change memory cell MC1 of a plurality of phase change memory cells in a memory cell array is illustrated in FIG. 15. The I/O circuit 407 is an example which is applicable to the phase change memory cell MC1.

Referring to FIG. 15, the phase change memory cell MC1 is coupled between a wordline WLi selected based on a row address ADDX and a bitline BLi selected by a transistor Ty in response to a bit LYi of a column address ADDY. The phase change memory cell MC1 has a configuration as described with reference to FIG. 10. In addition, FIG. 15 illustrates a write driver 410 for writing data into the phase change memory cell MC1, and a sensing unit 450 for reading the stored data from the phase change memory cell MC1. The configuration of FIG. 15 may be applied to a phase change memory cell of a unipolar type.

The write driver 410 may include transistors T11, T12, T13, T14 and T15 and latch circuit 415. The transistors T11 and T12 constitute a current mirror 414 and the current mirror 414 and the transistor T13 constitute a pulse providing unit 412. When a read enable signal WEN is activated to logic high level, the transistor T15 is turned ON to electrically connect the write driver 410 and the bitline BLi. The write pulse IP is provided from the current mirror 412 to the phase change memory cell MC1 in response to the first control voltage VC1, a voltage due to the write pulse IP is applied to two terminals of the phase change element RE1.

The latch circuit 415 provides a voltage corresponding to an input bit DIi to a gate of the transistor T14 in response to a write control signal CSR, and thus the transistor T14 is turned ON or OFF according to the input bit DIi. For example, when the write control signal CSR indicates a set-write operation for programming an ON-state of relatively low resistance, the output of the latch circuit 415 may have a corresponding level for providing the set voltage (Vset) and the transistor T14 may be turned ON if the input bit DIi is "1". In contrast, when the write control signal CSR indicates a reset-write operation for programming an OFF-state of relatively high resistance, the output of the latch circuit 415 may have a corresponding level for providing the reset voltage (Vset) and the transistor T14 may be turned ON if the input bit DIi is "0".

The sensing unit 450 may include transistors T51, T52 and T53 and a sense amplifier 454. The transistors T52 and T53 constitute a precharge circuit 452. When a read enable signal REN is activated to a logic high level, the transistor T51 is turned ON to electrically connect the sensing unit 450 to the bitline BLi. When a discharge signal DIS is activated to a logic high level, the transistor T53 is turned ON, and the bitline BLi may be initialized to a ground level.

The second control voltage VC2, i.e., a precharge signal PRE is activated to a logic low level, the transistor T52 is turned ON, and the bitline BLi may be charged to a precharge voltage VPRE. The sense amplifier 454 compares a sensed voltage Vr with a reference voltage VREF to generate an output bit DOi indicating whether the memory cell MC1 is in the ON-state or the OFF-state. The output bit DOi provided to an external device during a read operation, or the output bit DOi is provided to the latch circuit 415 as a comparison signal CPS indicating whether the phase change memory cell MC1 passes the verification or not during a verification operation for verifying whether programming of a desired state is completed. In addition, the comparison signal CPS is provided to the control circuit 500 in FIG. 9, and the control circuit 500 controls a number and intervals of applying the verification (read) pulse by adjusting activation intervals and activation number of the second control voltage VC2, i.e., the precharge signal PRE according to the comparison signal CPS. That is, the control circuit may adjust the number and intervals of applying the verification (read) pulse IV by adjusting activation intervals and activation number of the second control voltage VC2.

The latch circuit 415 may turn OFF the transistor T14 regardless of the value of the input bit DIi when the comparison signal CPS indicates that the phase change memory cell MC1 passes the verification.

Figure 16:
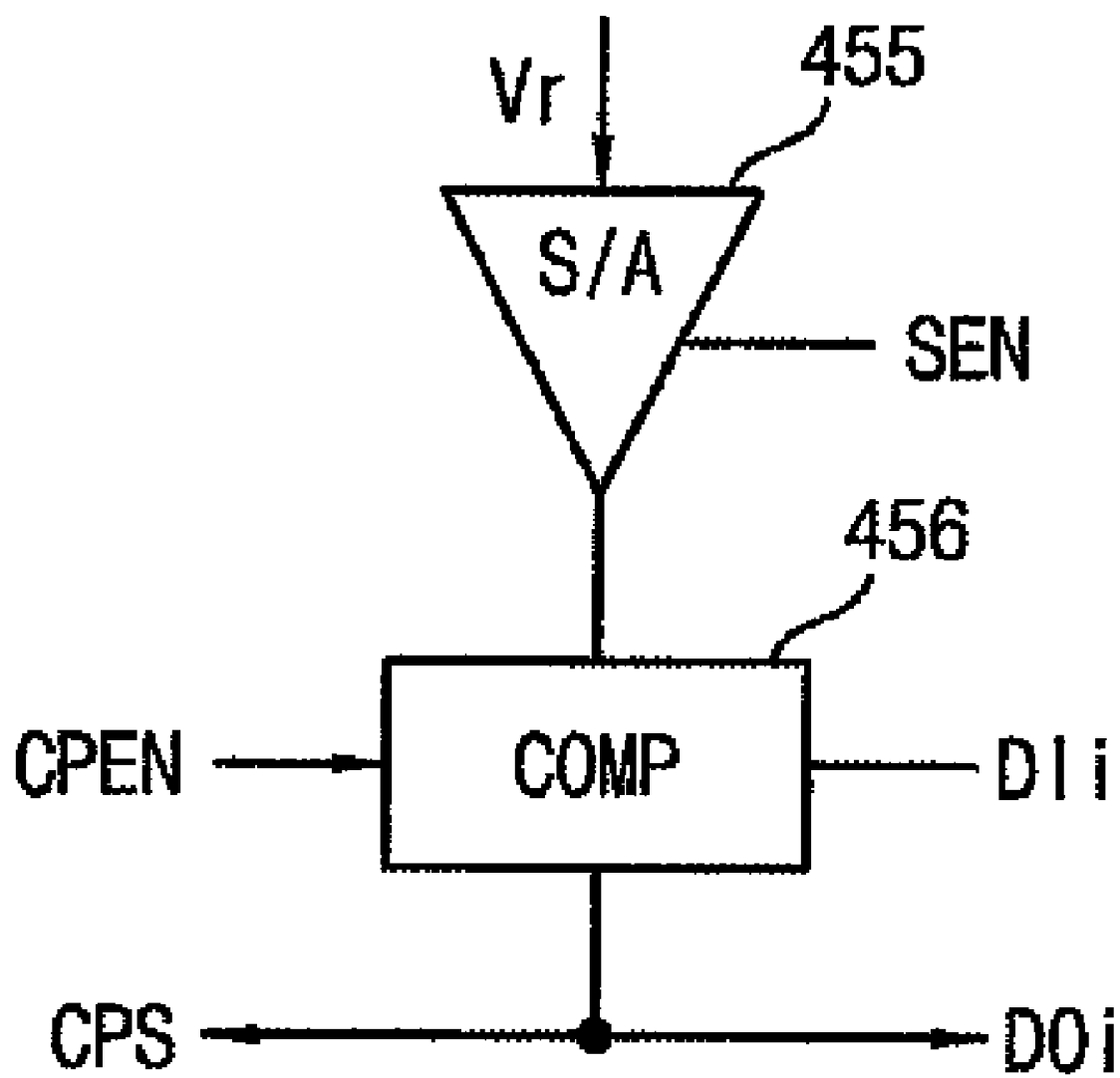
FIG. 16 is a circuit diagram illustrating another variation of the sense amplifier incorporated in the I/O circuit of FIG. 15.

FIG. 16 is a circuit diagram illustrating another possible version of the sense amplifier in FIG. 15.

Referring to FIGS. 15 and 16, a sense amplifier 455 and a comparator 456 may replace the sense amplifier 454 in FIG. 15.

The sense amplifier 455 senses a read voltage Vr in response to a sense enable signal SEN, and the comparator compares an output of the sense amplifier 455 and the input bit (data) DIi to provide the comparison result as a comparison signal CPS, in response to a comparison enable signal CPEN. The input bit DIi may be provided from the I/O buffer 700 in FIG. 9. The output bit DOi provided to an external device during a read operation, or the output bit DOi is provided to the latch circuit 415 as the comparison signal CPS indicating whether the phase change memory cell MC1 passes the verification or not during a verification operation for verifying whether programming of a desired state is completed. In addition, the comparison signal CPS is provided to the control circuit 500 in FIG. 9, and the control circuit 500 controls a number and intervals of applying the verification (read) pulse by adjusting activation intervals and activation number of the second control voltage VC2, i.e., the precharge signal PRE according to the comparison signal CPS. That is, the control circuit may adjust the number and intervals of applying the verification (read) pulse IV by adjusting activation intervals and activation number of the second control voltage VC2.

Figure 17:
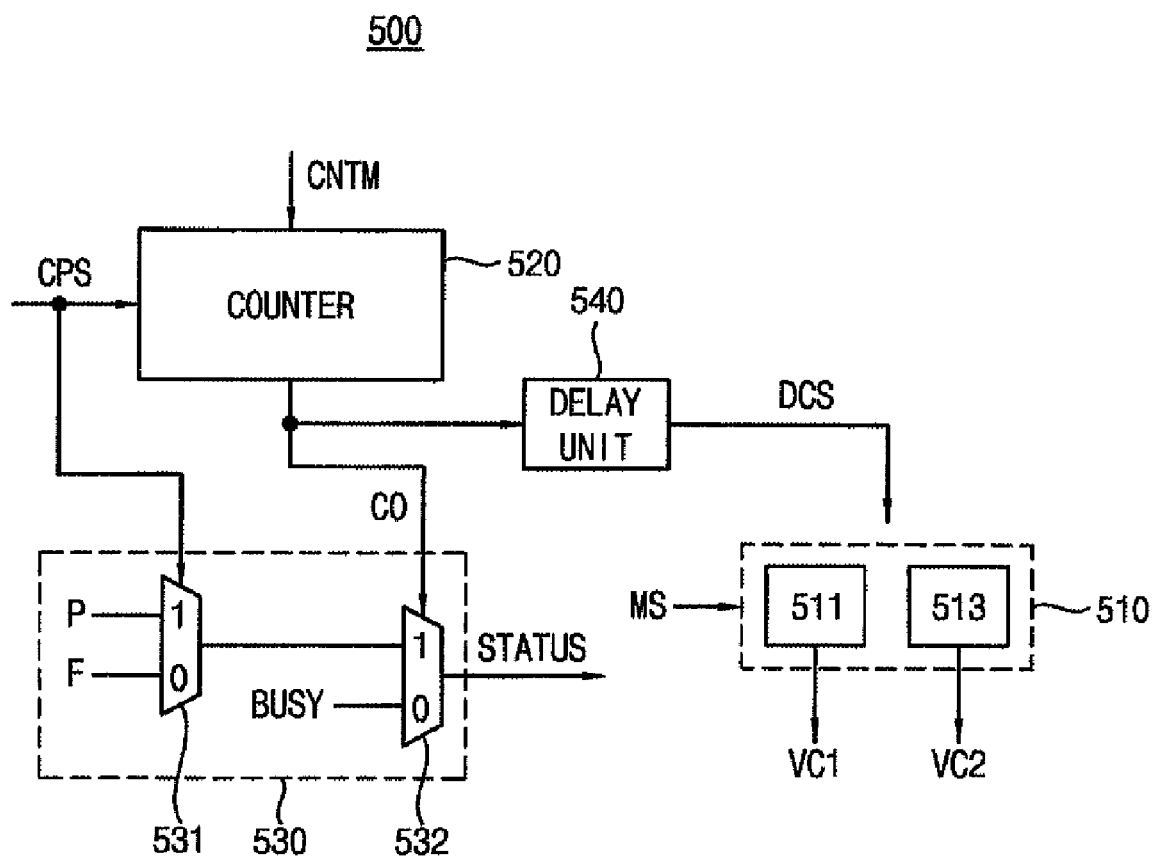
FIG. 17 is a circuit diagram illustrating one example of the control circuit in the phase change memory device of FIG. 9.

FIG. 17 is a circuit diagram illustrating an example of the control circuit in the phase change memory device of FIG. 9.

Referring to FIG. 17, the control circuit 500 comprises a control voltage generating unit 510, a counter 520, a delay unit 540 and a state circuit 530.

The control voltage generating unit 510 includes a first generating circuit 511 for generating the first control voltage VC1 for generating and controlling the write pulse and a second generating circuit 513 for generating the second control voltage VC2 for generating and controlling the verification pulse. The control voltage generating unit 510 generates the first control voltage VC1 or the second control voltage VC2 according to the mode signal MS. When the mode signal MS indicates a write operation, the first generating circuit 511 generates the first control voltage VC1 such that the write pulse IP in FIG. 14 is applied to the selected phase change memory cell. When the mode signal MS indicates a verification operation (or a read operation), the second generating circuit 513 generates the second control voltage VC2 such that the verification pulse IV in FIG. 14 is applied to the programmed phase change memory cell.

The counter 520 receives the comparison signal CPS indicating whether the phase change memory cell MC1 passes the verification or not. The counter 520 counts an input number of the comparison signal CPS. The state circuit 530 may include a first multiplexer 531 and a second multiplexer 532. The first multiplexer 531 selects and outputs one of a program pass P and a program fail F in response to the comparison signal CPS. For example, when the comparison signal CPS is a logic high level (that is, when the comparison signal CPS indicates the verification pass), the first multiplexer 531 outputs the program pass P. For example, when the comparison signal CPS is a logic low level (that is, when the comparison signal CPS indicates the verification fail), the first multiplexer 531 outputs the program fail F.

The counter 520 counts the comparison signal CPS. That is, the counter 520 increases a counting value whenever the comparison signal CPS is input. The counter 520 outputs an output signal CO having a logic high level, when the comparison signal CPS is a logic high level. In addition, the counter 520 outputs the output signal CO having a logic high level, when the counting number of the comparison signal CPS is equal to or more than a predetermined value CNTM. The counter 520 outputs the output signal CO having a logic low level, when the counting number of the comparison signal CPS is less than the predetermined value CNTM or when the comparison signal CPS is a logic low level. The second multiplexer 532 outputs the output of the first multiplexer 531 as a state signal STATUS, when the output signal CO is a logic high level. In addition, the second multiplexer 532 outputs a busy signal BUSY as the state signal STATUS, when the output signal CO is a logic low level. That is, the second multiplexer 532 outputs the program pass P as the state signal STATUS, when the counter 520 receives the comparison signal CPS having a logic high level. The second multiplexer 532 outputs the busy signal BUSY as the state signal STATUS, when the phase change memory cell MC1 does not pass the verification within the predetermined value CNTM. In addition, the second multiplexer 532 outputs the program fail F as the state signal STATUS, when a number of the phase change memory cell MC1 not passing the verification exceeds the predetermined value CNTM.

The delay unit 540 generates a delay control signal DCS in response to the output signal CO. The delay unit 540 may generate the delay control signal DCS having an increasing or a constant delay time according to an input number of the output signal CO. The delay control signal DCS is provided to the second generating circuit 513, and the second generating circuit 513 may delay a generating time of the second control voltage VC2 to delay an applying time of the verification pulse IV. In addition, the delay control signal DCS is may be applied to the sense amplifier 454 in FIG. 15 or to the comparator 456 in FIG. 16 instead of being applied to the second generating circuit 513 to delay a sensing time or a comparing time of the read voltage Vr.

In addition, the state signal STATUS may be applied to the second generating circuit 513, and is used to control of generating the second control voltage VC2. For example, when the stats signal STATUS having a logic high level is applied to the second generating circuit 513, the second generating circuit 513 stops generating the second control voltage VC2 such that the verification pulse IV is not applied to the phase change memory cell MC1 any more.

Figure 18:
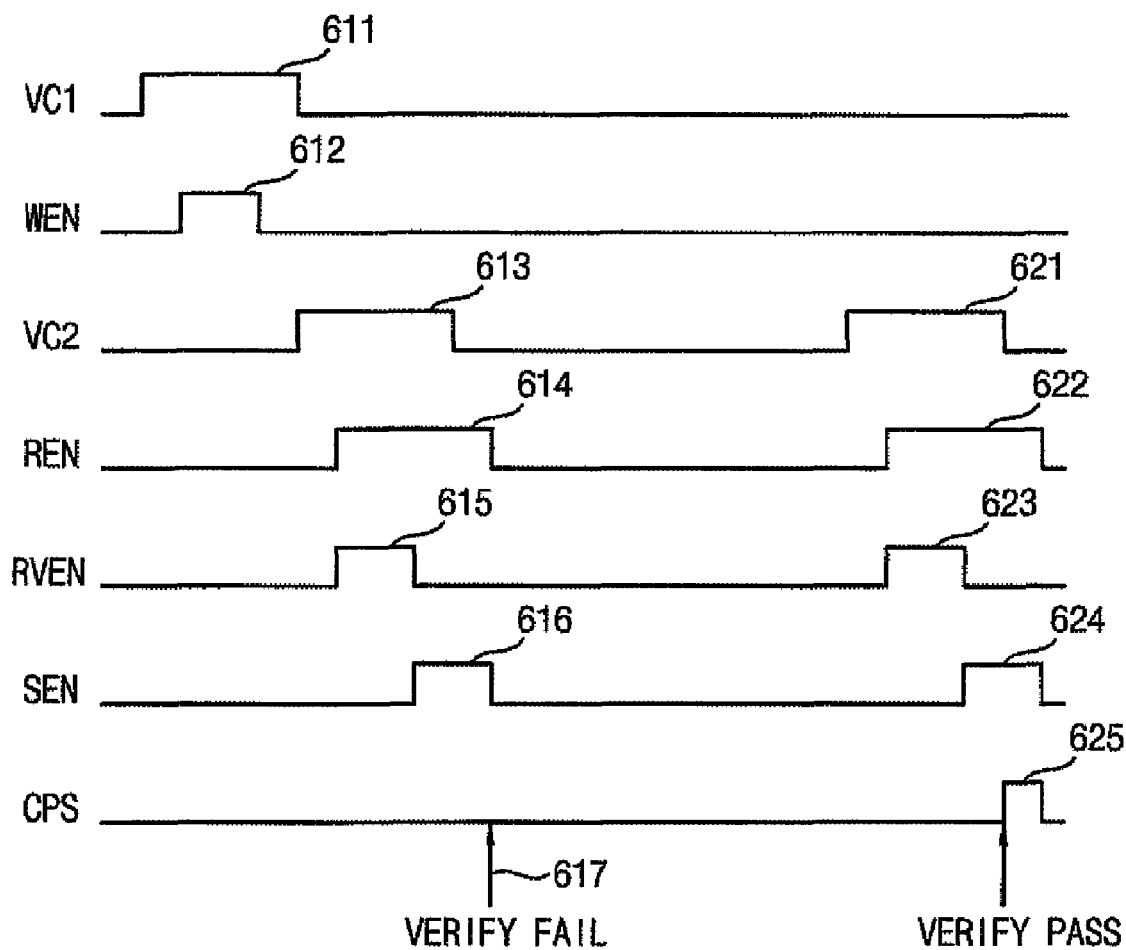
FIG. 18 is a timing diagram further illustrating various control signals applied with the I/O circuit of FIG. 14.

FIG. 18 is a timing diagram further illustrating various control signals applied within the I/O circuit of FIG. 14.

Referring to FIGS. 9, 14 and 18, when the operation mode (i.e. the mode signal MS) is a write operation, the first control voltage VC1 is activated 611, and the write pulse IP is generated in response to the first control voltage VC1. The write pulse IP is applied to the phase change memory cell MC1 in response to an activation 612 of the write enable signal WEN, and thus, input data (bit) DIi is programmed into the phase change memory cell MC1. When the operation mode is a verification (read) operation, the second control voltage VC2 is activated 613, and the verification pulse IV is generated in response to the second control voltage VC2. The verification pulse IV is applied to the phase change memory cell MC1 in response to an activation 614 of the read enable signal REN and an activation 615 of the verify enable signal RVEN. The read voltage Vr is compared with the input bit DIi in response to an activation 616 of the sense enable signal SEN, and the comparison result is provided as the comparison signal CPS. When the input bit DIi is reset data, the comparison signal CPS is a logic low level indicating the verification fail 617. The second control voltage VC2 is generated again 621, and the verification pulse IV is generated again in response to the second control voltage VC2. The verification pulse IV is applied to the phase change memory cell MC1 in response to an activation 622 of the read enable signal REN and an activation 613 of the verify enable signal RVEN. The read voltage Vr is compared with the input bit DIi in response to an activation 624 of the sense enable signal SEN, and the comparison result is provided as the comparison signal CPS. When the input bit DIi is set data, the comparison signal CPS is a logic high level indicating the verification pass 625.

With reference to FIGS. 8 through 18, the phase change memory device and memory system according to certain embodiments of the inventive concept may apply the write (reset) pulses to the phase change layer (material, the VR or GST in FIG. 12), may apply the verification pulses to the phase change layer (T1 in FIG. 3 before the resistance of the phase change layer reaches to the stable state (amorphous state in FIG. 3), and may vary a number of applying the verification pulses and intervals of applying the verification pulses according to each verification result of each of the phase-change memory cells MC1. In addition, as illustrated in FIG. 7, the verification operation may be simultaneously performed in a plurality of groups after the buffered program is performed on the plurality of phase change memory cells using the I/O buffer 700 and the I/O circuit 400.

In certain embodiments of the inventive concept, program and verification of the reset data using reset pulses are mainly explained. However, as mentioned above, program efficiency may be enhanced when the reset data is firstly programmed into the phase change memory cells, and then set data is programmed using the set pulse 12 in FIG. 2.

Phase change memory devices are nonvolatile memory devices capable of retaining stored date even when disconnected from an external power supply. Phase change memory devices support random data access and provide high-speed data read and processing performance. As a result, phase change memory devices may be beneficially used for storing program code. As portable electronic devices such as cellular phones, personal digital assistants (PDA), digital cameras, portable game consoles, and MP3 players continue to proliferate, phase change memory devices may be used in these devices to provide data storage as well as code storage. In addition, the phase change memory devices may be beneficially used in home applications such as high-definition televisions (HDTVs), a digital video disk (DVD) players, routers, and global positioning systems (GPS).

Figure 19:
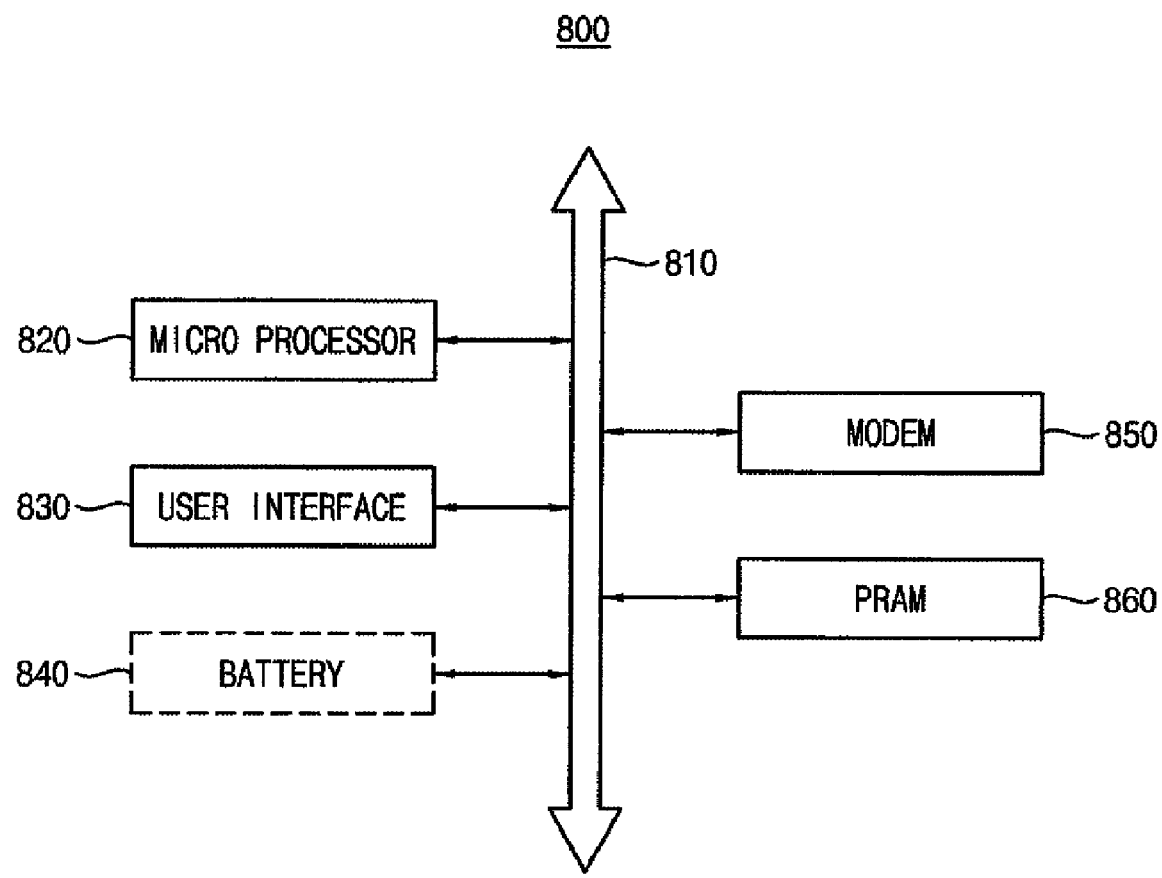
FIG. 19 is a general block diagram of a system incorporating a phase change memory device according to certain embodiments of the inventive concept.

FIG. 19 illustrates a system including the phase change memory device according to certain embodiments of the inventive concept.

Referring to FIG. 19, a system 800 comprises a microprocessor 820 connected to a bus 810, a user interface 830, a modem 850 such as baseband chipset and a phase change memory device 860 (denoted PRAM in FIG. 19). The legend "PRAM" here denotes "phase change random access memory". In the system 800, the phase change memory device 860 may be embodied, for example, by any of the phase change memory devices illustrated in FIGS. 9 through 16. The phase change memory device 860 stores data processed/to be processed by the microprocessor 820. When the system 800 is a mobile electronic device, a battery 840 may be provided to supply operational power. Although not illustrated, the system 800 may further include other elements such as an application chipset, a camera image processor (CIS), a mobile DRAM, a NAND flash memory, and so on.

As described above, programming time and current consumption may be reduced and overall program efficiency may be enhanced by varying the number of applied verification pulses, as well as the intervals at which the verification pulses are applied in accordance with a verification result for each of the phase-change memory cells within certain embodiments of the inventive concept. Therefore, embodiments of the inventive concept may be widely applicable to fields of uses that require phase change memory devices providing large data storage capacity.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming a phase change memory device, the method comprising:
    programming write data in a plurality of phase change memory cells by applying write pulses to each of the plurality of phase change memory cells; and
    verifying whether each of the phase change memory cells is programmed by applying verification pulses to each of the phase-change memory cells,
    wherein a number of applications for the verification pulses and corresponding intervals between the applications of the verification pulses are varied in accordance with a verification result for each of the phase-change memory cells,
    the verification pulses are not applied to a first phase change memory cell when the first phase change memory cell passes verification,
    the verification pulses are continuously applied to a second phase change memory cell until the second phase change memory cell passes verification within a defined number of applications for the verification pulses, and
    the verification pulses are applied to each of the phase-change memory cells at regular intervals.

2. A method of programming a phase change memory device, the method comprising:
    programming write data in a plurality of phase change memory cells by applying write pulses to each of the plurality of phase change memory cells; and
    verifying whether each of the phase change memory cells is programmed by applying verification pulses to each of the phase-change memory cells,
    wherein a number of applications for the verification pulses and corresponding intervals between the applications of the verification pulses are varied in accordance with a verification result for each of the phase-change memory cells,
    the verification pulses are not applied to a first phase change memory cell when the first phase change memory cell passes verification,
    the verification pulses are continuously applied to a second phase change memory cell until the second phase change memory cell passes verification within a defined number of applications for the verification pulses, and
    the verification pulses are applied to each of the phase-change memory cells at increasing intervals.

3. A method of programming a phase change memory device, the method comprising:
    programming write data in a plurality of phase change memory cells by applying write pulses to each of the plurality of phase change memory cells; and
    verifying whether each of the phase change memory cells is programmed by applying verification pulses to each of the phase-change memory cells,
    wherein a number of applications for the verification pulses and corresponding intervals between the applications of the verification pulses are varied in accordance with a verification result for each of the phase-change memory cells,
    the verification pulses are not applied to a first phase change memory cell when the first phase change memory cell passes verification,
    the verification pulses are continuously applied to a second phase change memory cell until the second phase change memory cell passes verification within a defined number of applications for the verification pulses, and
    the second phase change memory cell is determined to fail verification when the second phase change memory cell does not pass verification within the defined number of applications for the verification pulses.

4. The method of claim 3, wherein the write pulses and the verification pulses are repeatedly applied to the second phase change memory cell which is determined to fail verification.

5. The method of claim 1, wherein verifying whether each of the phase change memory cells is programmed is simultaneously performed on a plurality of groups, each group including the phase change memory cells.

6. A phase change memory device, comprising:
    a memory cell array including a plurality of phase change memory cells;
    an input/out (I/O) circuit, connected to each of the phase change memory cells through each of plurality of bit line selection transistors and configured to perform a program operation, a verification operation and a read operation on the phase change memory cells; and
    a control circuit configured to control the I/O circuit such that write data is programmed in the phase change memory cells by applying write pulses to each of the phase change memory cells, such that a determination of whether each of the phase change memory cells is programmed is verified by applying verification pulses to each of the phase-change memory cells, wherein a number of applications of the verification pulses and corresponding intervals between applications of the verification pulses are varied in accordance with a verification result for each of the phase-change memory cells,
    wherein the I/O circuit comprises;
        a write driver configured to program the write data in each of the phase change memory cells by providing write pulses to each of the phase change memory cells in response to a first control signal, and
        a sensing unit configured to provide the verification pulses to each of the phase-change memory cells in response to a second control signal, to sense data programmed in each of the phase-change memory cells in response to a third control signal and to compare the sensed data with the write data to provide a comparison signal.

7. The phase change memory device of claim 6, wherein the sensing unit comprises:
    a precharging unit configured to apply the verification pulses to the phase change memory cell;
    a sense amplifier configured to sense the data written in the phase change memory cell; and
    a comparator configured to compare the sensed data with the write data to provide the comparison signal.

8. The phase change memory device of claim 6, wherein the sensing unit comprises:
    a precharging unit configured to apply the verification pulses to the phase change memory cell; and
    a sense amplifier configured to compare the data written in the phase change memory cell with a reference voltage to provide the comparison signal.

9. The phase change memory device of claim 6, wherein the control circuit comprises:
- a control voltage generating unit configured to generate first and second control voltages for generating the write pulses and the verification pulses;
- a counter configured to count the comparison signal from the sensing unit to provide an output signal;
- a delay unit configured to generate a delay control signal for controlling an applying time of the verification pulses, in response to the output signal; and
- a state circuit configured to receive the comparison signal and the output signal to output a state signal representing whether each of the phase change memory cells is programmed.

10. The phase change memory device of claim 9, wherein the control circuit controls the state circuit such that the state signal represents a pass when the comparison signal represents a program pass.

11. The phase change memory device of claim 9, wherein the control circuit controls the state circuit such that the state signal represents a fail, when the comparison signal does not represents a program pass within a predetermined value.

12. The phase change memory device of claim 6, further comprising:
- an I/O buffer configured to temporarily store the write data, wherein the control circuit controls the I/O buffer and the I/O circuit, such that the verification operation is simultaneously performed across a plurality of groups, each group including the phase change memory cells.

13. The method of claim 2, wherein verifying whether each of the phase change memory cells is programmed is simultaneously performed on a plurality of groups, each group including the phase change memory cells.

14. The method of claim 3, wherein verifying whether each of the phase change memory cells is programmed is simultaneously performed on a plurality of groups, each group including the phase change memory cells.

* * * * *